March 9, 1965 W. LOEWENSTERN, JR 3,173,102

SOLID STATE MULTIPLE STREAM TRAVELLING WAVE AMPLIFIER

Filed Dec. 6, 1962

INVENTOR.
WALTER LOEWENSTERN, JR.
BY Jack M. Wiseman
ATTORNEY

United States Patent Office 3,173,102

Patented Mar. 9, 1965

3,173,102

SOLID STATE MULTIPLE STREAM TRAVELLING WAVE AMPLIFIER

Walter Loewenstern, Jr., 2065 Latham St., Mountain View, Calif.

Filed Dec. 6, 1962, Ser. No. 242,660
13 Claims. (Cl. 330—39)

The present invention relates in general to high frequency amplifiers, and more particularly to a high frequency amplifier employing a semiconductor device.

An object of the present invention is to provide an amplifier with a semi-conductor device that may be employed in lieu of a conventional travelling wave tube for the amplification of high frequency signals.

Another object of the present invention is to provide an amplifier with a semiconductor device employing travelling wave principles for the amplification of high frequency signals.

Another object of the present invention is to provide an amplifier with a semiconductor device wherein the interaction of streams of charged particles produces the amplification of high frequency signals.

Another object of the present invention is to provide a semiconductor device for the amplification of microwave signals.

Another object of the present invention is to provide a device for the amplification of microwave signals which has minimum weight and size.

Another object of the present invention is to provide a device for the amplification of microwave signals that has greater reliability.

Another object of the present invention is to a device for the amplification of microwave signals that is economical to manufacture without sacrificing durability.

Other and further objects and advantages of the present invention will be apparent to one skilled in the art from the following description taken in conjunction with the accompanying drawings, in which.

Conventionally, a travelling wave tube depends for its characteristics upon the interaction between the field of an electromagnetic wave propagated along a slow wave structure, such as a helix, and a beam of electrons travelling with the wave, as for example, by travelling axially within the helix at a velocity greater than the velocity of the propagated electromagnetic wave travelling along the helix. It is well recognized that an electron beam can function as a special type of transmission line capable of progagating slow electromagnetic fields. In the present invention, a slow wave structure is provided by a first stream of charged particles flowing in a predetermined path through a semiconductor material and thus obviate the need of a helix. In addition, a second stream of charged particles flows in a predetermined path through a semiconductor material, whereby the second stream of charged particles flow at a higher velocity than the first stream of charged particles.

According to the present invention, a pair of closely coupled streams of charged particles flow along predetermined paths within semiconductor material, such as germanium or silicon, in the same or in opposite directions at respectively different velocities. At the beginning of the paths, one stream of charged particles, while advancing in the semiconductor material, is modulated under the control of a microwave signal to be amplified. Electromagnetic interaction between the charged particles of the respective streams, while advancing within the semiconductive material in respective paths, causes the impressed variations to grow in amplitude and the amplified signal energy is withdrawn at the end of the paths. Gain is dependent to a large degree upon the closeness of the electromagnetic coupling between the streams of charged particles. It is recognized that both streams can be modulated simultaneously or the second stream can be modulated.

Figures 1, 2:
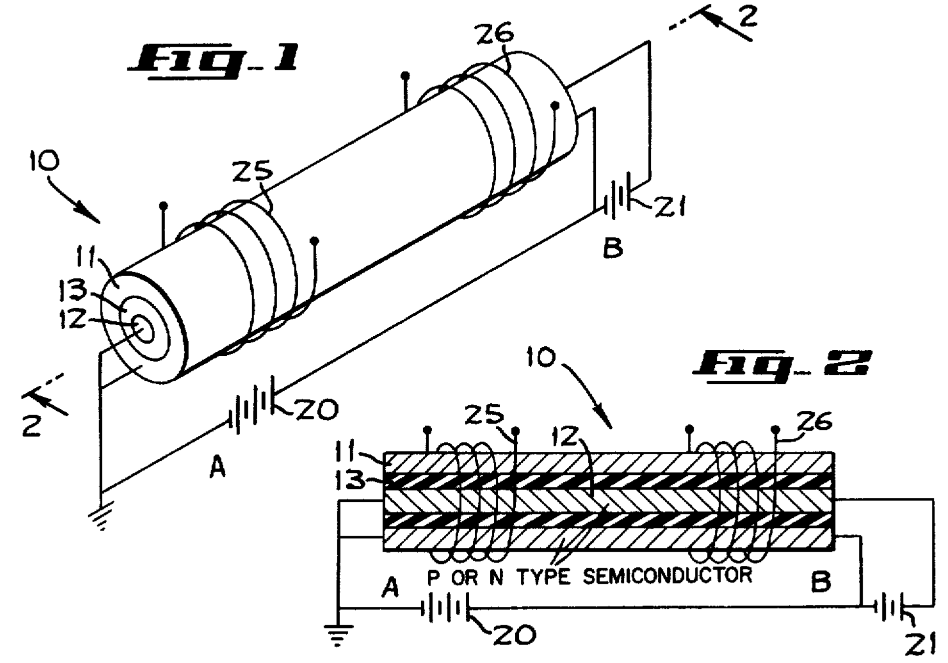
FIG. 1 is a diagrammatic illustration of an amplifier with a semiconductor device embodying the present invention.
FIG. 2 is a vertical sectional view taken along line 2—2 of FIG. 1.

Illustrated in FIGS. 1 and 2 is a high frequency amplifier with a semiconductor device 10 of the present invention for amplifying high frequency signals such as microwave signals. The semiconductor device 10 comprises a tubular member or layer 11 formed from a semiconductor material, such as germanium or silicon. Disposed within the tubular member 11 along the cylindrical axis thereof is a solid rod-shaped member or layer 12 formed from a semiconductor material, such as germanium or silicon. Interposed between the tubular semiconductor member 11 and the rod semiconductor member 12 is a tubular member of layer 13 made of insulating material. The tubular insulator member 13 which has a relatively thin wall, is in flush contact with the tubular semiconductor member 11 and the rod semiconductor member 12. In lieu of an insulating member, the semiconductor members 11 and 12 may be formed of silicon with different doping densities and in combination with applied potential produce a back biased junction, which will function as an insulator.

At the input end of the semiconductor device 10 is a zone A and at the output end of the semiconductor device 10 is zone B. At the zone A, the negative terminal of a battery 20 is connected to both the tubular semiconductor member 11 and the rod semiconductor member 12. Thus, the semiconductor device 10 is at ground potential at zone A. The positive terminal of the battery 20 is connected to the tubular semiconductor member 11 at the zone B. In addition, the positive terminal of a battery 21, which is in series with the battery 20, is connected to the rod semiconductor member 12 at the zone B.

Hence, at zone B the tubular semiconductor member 11 is more positive than at zone A. Further at zone B the rod semiconductor member 12 is more positive than at zone A and, also, at zone B it is more positive than the tubular semiconductor member 11 is at zone B. From the foregoing, it is observed that a stream of charged particles flows from zone A to zone B along a predetermined path within the tubular semiconductor member 11 and a stream of charged particles flows from zone A to zone B along a predetermined path within the rod semiconductor member 12. The charged particles flow at a greater velocity within the rod semiconductor 12 than within the tubular semiconductor 11. This action results from the greater positive potential on the rod semiconductor 12 at zone B than on the tubular semiconductor 11 at zone B.

Wound around the tubular semiconductor member 11 as zone A is an input winding or coil 25 and wound around the tubular semiconductor member 11 at zone B is an output winding or coil 26. A high frequency signal of a microwave signal is impressed across the terminals of the input winding 25 from a suitable transmitting source, not shown. This action causes the stream of charged particles flowing in the tubular semiconductor member 11 to be modulated under the control of the signal impressed across the input winding 25.

The electromagnetic interaction between the stream of charged particles flowing in the rod semiconductor member 12 and the stream of charged particles flowing in the tubular semiconductor member 11 causes the impressed variations flowing in the tubular semiconductor 11 to grow in amplitude. The amplified signal and the amplified signal energy is withdrawn from the tubular semiconductor member 11 by means of the output winding 26 at zone B. Thus, an amplified signal at high or microwave frequencies is removed at the terminals of the output winding 26.

In practice, the rod-shaped semiconductor member 12 may be formed or grown. Then, the insulator member 13 is formed or grown as a layer therearound. Subsequently, the tubular semiconductor member 11 is formed or grown as a layer around the insulator member 13.

Figures 3, 4:
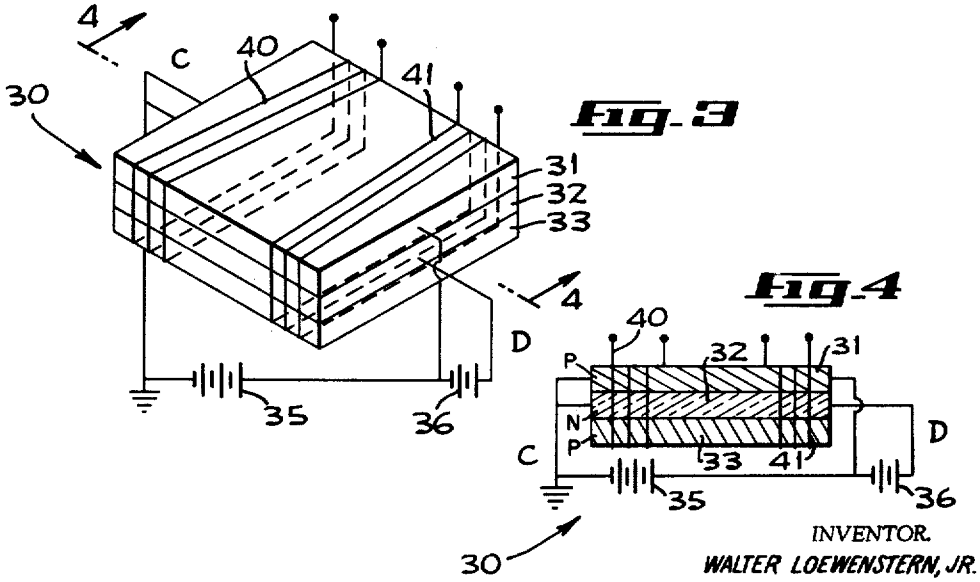
FIG. 3 is a diagrammatic illustration of an amplifier with a modified semiconductor device.
FIG. 4 is a vertical sectional view taken along line 4—4 of FIG. 3.

Illustrated in FIGS. 3 and 4 is an amplifier with a semiconductor device 30 for amplifying high frequency signals, such as microwave signals, which device is a modification of the semiconductor device 10 shown in FIGS. 1 and 2. The semiconductor device 30 comprises a flat layer or rectangular solid semiconductor member 31 of suitable type, such as P-type. Disposed below and in engagement with the flat semiconductor member 31 is a flat layer or rectangular solid semiconductor member 32 of the opposite type, such as N-type. Supporting the semiconductor member 32 and in engagement therewith is a ceramic or semiconductor substrate 33 of the same type as the semiconductor member 31. The semiconductor members 31 and 32 may be formed from silicon of different doping densities, which in combination with applied potential produces a back biased junction. The back biased junction will function as an insulator between the flat semiconductor members 31 and 32. Similarly, an insulating layer can be employed. It is apparent that a flat insulating member may be disposed between the flat semiconductor members 31 and 32 in lieu of a back biased junction.

At the input end of the semiconductor device 30 is zone C and at the output end of the semiconductor device 30 is zone D. At the zone C, the negative terminal of a battery 35 is connected to both the semiconductor members 31 and 32. Thus, the semiconductor device 30 is at ground potential at zone C. The positive terminal of the battery 35 is connected to the semiconductor member 31 at the zone D. In addition, the positive terminal of the battery 36 which is in series with the battery 35, is connected to the semiconductor member 32 at zone D.

Hence at zone D the semiconductor member 31 is more positive than at zone C. Further, at zone D the semiconductor member 32 is more positive than the semiconductor member 31 is at zone D. From the foregoing, it is observed that a stream of charged particles flows from zone C to zone D along a predetermined path within the semiconductor member 31 and a stream of charged particles flows from zone C to zone D along a predetermined path within the semiconductor member 32. The charged particles flow at a greater velocity within the semiconductor member 32 than within the semiconductor member 31. This action results from the greater positive potential applied to the semiconductor member 32 at zone D than is applied to the semiconductor member 31 at zone C.

Coupled to the semiconductor member 31 at zone C is an input winding or coil 40 and coupled to the semiconductor member 31 at zone D is an output winding or coil 41. A high frequency signal or a microwave signal is impressed across the terminals of the input winding 40 from a suitable transmitting source, not shown. This action causes the stream of charged particles flowing in the semiconductor member 31 to be modulated under the control of the signal impressed across the input winding 40.

The electromagnetic interaction between the stream of charged particles flowing in the semiconductor member 32 and the stream of charged particles flowing in the semiconductor member 31 causes the impressed variations flowing in the semiconductor member 31 to grow in amplitude. The amplified signal and the amplified signal energy is withdrawn from the semiconductor member 31 by means of the output winding 41 at zone D. Thus, an amplified signal at high or microwave frequencies is removed at the terminals of the output winding 26.

While the input and output arrangements have been described as windings or coils, other arrangements common to microwave structures may be employed. Although, the stream of charged particles are described as flowing in the same directions within the semiconductor elements, it is apparent that the stream of charged particles within the semiconductor members of the same device may flow in opposite directions. The foregoing arrangements may be employed as oscillators by proper adjustments of the input and output windings. It is recognized that both streams of charged particles can be modulated simultaneously or modulated respectively.

It is to be understood that modifications and variations of the embodiments of the invention disclosed herein may be resorted to without departing from the spirit of the inventions and the scope of the appended claims.

Having thus described my invention, what I claim as new and desire to protect by Letters Patent is:

1. A high frequency travelling wave amplifier for microwave signals comprising a first semiconductor member for directing a first stream of charged particles along a first predetermined path, means connected to said first semiconductor member for producing a flow of charged particles along said first predetermined path, means coupled to said first semiconductor member for producing microwave signal variations in said first stream of charged particles, a second semiconductor member for directing a second stream of charged particles along a second predetermined path, means connected to said second semiconductor member for producing a flow of charged particles along a second predetermined path, said first and second semiconductor members being disposed relative to one another to electromagnetically couple said first and second streams of charged particles for electromagnetic interaction to produce an amplification of the microwave signal variations in said first stream of charged particles, and means coupled to said first semiconductor member for removing from said first semiconductor member an amplified microwave signal.

2. A high frequency travelling wave amplifier for microwave signals comprising a first semiconductor member for directing a first stream of charged particles along a first predetermined path, means connected to said first semiconductor for producing a flow of charged particles along said first predetermined path, means coupled to said first semiconductor member for producing microwave signal variations in said first stream of charged particles, a second semiconductor member for directing a second stream of charged particles along a second predetermined path, said second predetermined path being parallel with said first predetermined path, means connected to said second semiconductor member for producing a flow of charged particles along said second predetermined path, said first and second semiconductor members being disposed relative to one another to electromagnetically couple said first and second streams of charged particles for electromagnetic interaction to produce an amplification of the microwave signal variations in said first stream of charged particles, and means coupled to said first semiconductor member for removing from said first semiconductor member an amplified microwave signal.

3. A high frequency travelling wave amplifier for microwave signals comprising a first semiconductor member for directing a first stream of charged particles along a first predetermined path, means connected to said first semiconductor for producing a flow of charged particles along said first predetermined path, means coupled to said first stream of charged particles for producing microwave signal variations in said first stream of charged particles, a second semiconductor member for directing a second stream of charged particles along a second predetermined path, said second predetermined path being coaxial with said first predetermined path, means connected to said second semiconductor member for producing a flow of charged particles along said second predetermined path, said first and second semiconductor members being disposed relative to one another to electromagnetically couple said first and second streams of charged particles for electromagnetic interaction to produce an amplification of the microwave signal variations in said first stream of charged particles, and means coupled to said first semiconductor member for removing from said first semiconductor member an amplified microwave signal.

4. A high frequency travelling wave amplifier for microwave signals comprising a first semiconductor member for directing a first stream of charged particles along a first predetermined path, means connected to said first semiconductor member for producing a flow of charged particles along said first predetermined path, means coupled to said first semiconductor member for producing microwave signal variations in said first stream of charged particles, a second semiconductor member for directing a second stream of charged particles along a second predetermined path, means connected to said second semiconductor member for producing a flow of charged particles along said second predetermined path at a different velocity than the flow of charged particles along said first predetermined path, said first and second semiconductor members being disposed relative to one another to electromagnetically couple said first and second streams of charged particles for electromagnetically interaction to produce an amplification of the microwave signal variations in said first stream of charged particles, and means coupled to said first semiconductor member for removing from said first semiconductor member an amplified microwave signal.

5. A high frequency travelling wave amplifier for microwave signals comprising a hollow semiconductor member for directing a first stream of charged particles along a predetermined path, means connected to said hollow semiconductor member for producing a flow of charged particles along said first predetermined path, means coupled to said hollow semiconductor member for producing microwave signal variations in said first stream of charged particles, a second semiconductor member disposed within said hollow semiconductor member for directing a second stream of charged particles along a second predetermined path, means connected to said second semiconductor member for producing a flow of charged particles along said second predetermined path, said hollow semiconductor member and said second semiconductor member being disposed relative to one another to electromagnetically couple said first and second streams of charged particles for electromagnetic interaction to produce an amplification of the microwave signal variations in said first stream of charged particles, and means coupled to said hollow semiconductor member for removing from said hollow semiconductor member an amplified microwave signal.

6. A high frequency travelling wave amplifier for microwave signals comprising a tubular semiconductor member for directing a first stream of charged particles along a predetermined path, means connected to said tubular semiconductor member for producing a flow of charged particles along said first predetermined path, means coupled to said tubular semiconductor member for producing microwave signal variations in said first stream of charged particles, a rod-shaped semiconductor member disposed within said tubular semiconductor member concentrically therewith for directing a second stream of charged particles along a second predetermined path, means connected to said rod-shaped semiconductor member for producing a flow of charged particles along said second predetermined path, said semiconductor members being disposed relative to one another to electromagnetically couple said first and second streams of charged particles for electromagnetic interaction to produce an amplification of the microwave signal variations in said first stream of charged particles, and means coupled to said tubular semiconductor member for removing from said tubular semiconductor member an amplified microwave signal.

7. A high frequency travelling wave amplifier for microwave signals comprising a tubular semiconductor member for directing a first stream of charged particles along a first predetermined path, means connected to said tubular semiconductor member for producing a flow of charged particles along said first predetermined path, means coupled to said tubular semiconductor member for producing microwave signal variations in said first stream of charged particles, a rod-shaped semiconductor member disposed within said tubular semiconductor member concentrically therewith for directing a second stream of charged particles along a second predetermined path, means connected to said rod-shaped semiconductor member for producing a flow of charged particles along said second predetermined path, a tubular insulator member interposed between said tubular and said rod-shaped semiconductor members concentrically therewith, said semiconductor members being disposed relative to one another to electromagnetically couple said first and second streams of charged particles for electromagnetic interaction to produce an amplification of the microwave signal variations in said first stream of charged particles, and means coupled to said tubular semiconductor member for removing from said tubular semiconductor member an amplified microwave signal.

8. A high frequency travelling wave amplifier for microwave signals comprising a first flat semiconductor member for directing a first stream of charged particles along a first predetermined path, means connected to said first flat semiconductor member for producing a flow of charged particles along said first predetermined path, means coupled to said first flat semiconductor member for producing microwave variations in said first stream of charged particles, a second flat semiconductor member disposed adjacent said first flat semiconductor member for directing a second stream of charged particles along a second predetermined path, means connected to said second flat semiconductor member for producing a flow of charged particles along said second predetermined path, said semiconductor members being disposed relative to one another to electromagnetically couple said first and second streams of charged particles for electromagnetic interaction to produce an amplification of the microwave signal variations in said first stream of charged particles, and means coupled to said first flat semiconductor member for removing from said first flat semiconductor member an amplified microwave signal.

9. A high frequency travelling wave amplifier for microwave signals comprising a first flat semiconductor member for directing a first stream of charged particles along a first predetermined path, means connected to said first flat semiconductor member for producing a flow of charged particles along said first predetermined path, means coupled to said first flat semiconductor member for producing a microwave signal in said first stream of charged particles, a second flat semiconductor member disposed adjacent said first flat semiconductor member for directing a second stream of charged particles along a second predetermined path, means connected to said second flat semiconductor member for producing a flow of charged particles along a second predetermined path at a velocity different than the velocity of the flow of charged particles along said first predetermined path, said semiconductor members being disposed relative to one another to electromagnetically couple said first and second streams of charged particles for electromagnetic interaction to produce an amplification of the microwave signal variations in said first stream of charged particles, and means coupled to said first flat semiconductor member for removing from said first flat semiconductor member an amplified microwave signal.

10. A high frequency travelling wave amplifier for microwave signals comprising a first flat semiconductor member for directing a first stream of charged particles along a first predetermined path, means connected to said first flat semiconductor member for producing a flow of charged particles along said first predetermined path, means coupled to said first flat semiconductor member for providing a microwave signal in said first stream of charged particles, a second flat semiconductor member disposed in contact with said first flat semiconductor member for directing a second stream of charged particles along a second predetermined path, said first and second flat semiconductor members being of different densities for creating a back biased junction therebetween, means connected to said second flat semiconductor member for producing a flow of charged particles along a second predetermined path, said semiconductor members being disposed relative to one another to electromagnetically couple said first and second streams of charged particles for electromagnetic interaction to produce an amplification of the microwave signal variations in said first stream of charged particles, and means coupled to said first flat semiconductor member for removing from said first flat semiconductor member an amplified microwave signal.

11. A high frequency travelling wave amplifier for microwave signals comprising a first flat semiconductor member for directing a first stream of charged particles along a first predetermined path, means connected to said first flat semiconductor member for producing a flow of charged particles along said first predetermined path, means coupled to said first flat semiconductor member for providing a microwave signal in said first stream of charged particles, a second flat semiconductor member disposed in contact with said first flat semiconductor member for directing a second stream of charged particles along a second predetermined path, said first and second flat semiconductor members being of different densities for creating a back biased junction therebetween, means connected to said second flat semiconductor member for producing a flow of charged particles along a second predetermined path at a different velocity than the velocity of the flow of charged particles along said first predetermined path, said semiconductor members being disposed relative to one another to electromagnetically couple said first and second streams of charged particles for electromagnetic interaction to produce an amplification of the signal variations in said first stream of charged particles, and means coupled to said first flat semiconductor member for removing from said first flat semiconductor member an amplified microwave signal.

12. A high frequency travelling wave amplifier for microwave signals comprising a tubular semiconductor member for directing a first stream of charged particles along a first predetermined path, means connected to said tubular semiconductor member for producing a flow of charged particles along said first predetermined path, means coupled to said tubular semiconductor member for producing microwave signal variations in said first stream of charged particles, a rod-shaped semiconductor member disposed within and in engagement with said tubular semiconductor member for directing a second stream of charged particles along a second predetermined path, said tubular and rod-shaped semiconductor members being of different densities for creating a back biased junction therebetween, means connected to said rod-shaped semiconductor member for producing a flow of charged particles along said second predetermined path, said semiconductor members being disposed relative to one another to electromagnetically couple said first and second streams of charged particles for electromagnetic interaction to produce an amplification of the microwave signal variations in said first stream of charged particles, and means coupled to said tubular semiconductor member for removing from said tubular semiconductor member an amplified microwave signal.

13. A high frequency travelling wave amplifier for microwave signals comprising a first flat semiconductor member for directing a first stream of charged particles along a first predetermined path, means connected to said first flat semiconductor member for producing a flow of charged particles along said first predetermined path, means coupled to said first flat semiconductor member for producing microwave signal variations in said first stream of charged particles, a second flat semiconductor member spaced from said first semiconductor member for directing a second stream of charged particles along a second predetermined path, a flat insulator member disposed between said first and second flat semiconductor members, means connected to said second flat semiconductor member for producing a flow of charged particles along a second predetermined path, said semiconductor members being disposed relative to one another to electromagnetically couple said first and second streams of charged particles for electromagnetic interaction to produce an amplification of the microwave signal variations in said first stream of charged particles, and means coupled to said first flat semiconductor member for removing from said first flat semiconductor member an amplified microwave signal.

References Cited by the Examiner

UNITED STATES PATENTS

| | | | |
|---|---|---|---|
| 2,756,285 | 7/56 | Shockley | 317—235 X |
| 2,898,477 | 8/59 | Hoesterey. | |
| 3,061,739 | 10/62 | Stone et al. | 317—234 X |
| 3,119,074 | 1/64 | Chang | 330—35 X |
| 3,122,655 | 2/64 | Murray | 307—88.5 |

ROY LAKE, *Primary Examiner.*

NATHAN KAUFMAN, *Examiner.*